US012271819B2

(12) United States Patent
Zhu et al.

(10) Patent No.: US 12,271,819 B2
(45) Date of Patent: Apr. 8, 2025

(54) MACHINE LEARNING NETWORK MODEL COMPRESSION

(71) Applicant: Huawei Technologies Co., Ltd., Shenzhen (CN)

(72) Inventors: Jiafeng Zhu, Pleasanton, CA (US); Wei Wei, Plano, TX (US); Jianle Chen, San Diego, CA (US); Wei Wang, Santa Clara, CA (US); Jie Shen, Santa Clara, CA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 943 days.

(21) Appl. No.: 17/371,590

(22) Filed: Jul. 9, 2021

(65) Prior Publication Data

US 2021/0342694 A1 Nov. 4, 2021

Related U.S. Application Data

(63) Continuation of application No. PCT/US2019/040723, filed on Jul. 5, 2019.

(60) Provisional application No. 62/790,387, filed on Jan. 9, 2019.

(51) Int. Cl.
*G06N 3/082* (2023.01)
*G06N 3/04* (2023.01)
*H03M 7/30* (2006.01)
*G06F 11/34* (2006.01)

(52) U.S. Cl.
CPC .............. *G06N 3/082* (2013.01); *G06N 3/04* (2013.01); *H03M 7/6005* (2013.01); *G06F 11/34* (2013.01)

(58) Field of Classification Search
CPC .......... G06N 3/082; G06N 3/04; G06F 11/34; H03M 7/6005
See application file for complete search history.

(56) References Cited

U.S. PATENT DOCUMENTS

| | | | |
|---|---|---|---|
| 12,026,078 B1 * | 7/2024 | Park | G06F 11/3423 |
| 2013/0107970 A1 | 5/2013 | Wang et al. | |
| 2015/0249828 A1 | 9/2015 | Rosewarne et al. | |
| 2016/0134889 A1 | 5/2016 | Park et al. | |

OTHER PUBLICATIONS

"Use cases and requirements for compressed representation of neural networks," International Organization for Standardization Organisation Internationale De Normalisation ISO/IEC JTC1/SC29/WG11 Coding of Moving Pictures and Audio, N17924, Oct. 2018, 37 pages.
Pal, C., et al., "Modified Huffman based compression methodology for Deep Neural Network Implementation on Resource Constrained Mobile Platforms," IEEE, 2018, 5 pages.

* cited by examiner

*Primary Examiner* — Joseph J Lauture
(74) *Attorney, Agent, or Firm* — Conley Rose, P.C.

(57) ABSTRACT

A first aspect relates to a computer-implemented method for performing model compression. The method includes compressing a machine learning (ML) network model comprising a multiple layer structure to produce a compressed ML network model. The compressed ML network model maintains the multiple layer structure of the ML network model. The method generates a model file for the compressed ML network model. The model file includes the compressed ML network model and decoding information for enabling the ML network model to be decompressed and executed layer-by-layer.

29 Claims, 6 Drawing Sheets

MACHINE LEARNING NETWORK MODEL COMPRESSION

CROSS-REFERENCE TO RELATED APPLICATIONS

This application is a continuation of International Application No. PCT/US2019/040723 filed on Jul. 5, 2019, by Futurewei Technologies, Inc., and titled "Machine Learning Network Model Compression," which claims the benefit of U.S. Provisional Patent Application No. 62/790,387 filed Jan. 9, 2019, by Jiafeng Zhu, et al., and titled "Deep Neural Network (DNN) Model Compression Format, Layer by Layer Decode Buffer Bit," each of which is hereby incorporated by reference.

TECHNICAL FIELD

The present disclosure relates generally to an artificial neuron network, and more specifically relates to machine learning network model compression.

BACKGROUND

An artificial neural network (ANN) is a computational model based on the structure and functions of biological neural networks. Information that flows through the network affects the structure of the ANN because a neural network changes—or learns, in a sense—based on that input and output. ANNs are considered nonlinear statistical data modeling tools where the complex relationships between inputs and outputs are modeled or patterns are found using machine learning algorithms. Such systems can "learn" to perform tasks by considering examples, generally without being programmed with any task-specific rules.

Convolutional neural networks are a type of feed-forward ANN. Convolutional neural networks may include collections of neurons that each have a receptive field and that collectively tile an input space. A receptive field may comprise only a local region of the input volume, such as where the neural network will be dealing with high-dimensional inputs and each neuron in the input layer cannot be practically linked to and receive all inputs. Alternatively, the receptive field may comprise links to all available inputs. Convolutional neural networks (CNNs) have numerous applications. In particular, CNNs have broadly been used in the area of pattern recognition and classification.

Deep learning architectures, such as deep belief networks (DBN), deep convolutional networks (DCN), and deep neural networks (DNN), are layered neural network architectures in which the output of a first layer of neurons becomes an input to a second layer of neurons, the output of a second layer of neurons becomes an input to a third layer of neurons, and so on. Therefore, a deep neural network may be defined as a neural network having multiple intermediate layers between the input layer and the output layer.

SUMMARY

The present disclosure applies to artificial neural networks, such as deep neural networks (DNNs) comprising multiple layers of neurons. A DNN that is trained to perform a particular task is called a model. For example, a DNN model can be used for image recognition, speech to text conversion, or language translation. These models tend to be very large in size, and can require a large amount of memory and/or processing capability for execution. Thus, limited resources devices such as phones, tablets, Internet of Things (IoT) devices, or other electronic devices typically do not include sufficient processing capability and memory to be able to store and execute a neural network model. To solve this problem, the present disclosure provides various embodiments for performing model compression and decompression to enable a limited resource device to store and execute a neural network model.

A first aspect relates to a computer-implemented method for performing model compression. The method includes compressing a machine learning (ML) network model comprising a multiple layer structure to produce a compressed ML network model. The compressed ML network model maintains the multiple layer structure of the ML network model. The method generates a model file for the compressed ML network model. The model file includes the compressed ML network model and decoding information for enabling the ML network model to be decompressed and executed layer-by-layer.

In a first implementation form of the computer-implemented method according to the first aspect, the decoding information is stored in a general header of the model file. In an implementation of the first implementation form, the model file further includes a serialization header. In another implementation of the first implementation form, the general header is the first eight bytes of the model file. In another implementation of the first implementation form, the general header provides a version, total header length, encoding type, framework type, and serialization type.

A second aspect relates to a computer-implemented method for executing a machine learning (ML) network model. The method includes obtaining a model file comprising a compressed ML network model and decoding information for enabling layer-by-layer decompression and execution. The decoding information includes a layer-by-layer flag. The method determines whether the layer-by-layer flag is set in the model file. In response to the layer-by-layer flag being set in the model file, the method decompresses an Nth layer of the compressed ML network model to generate a decompressed Nth layer of the ML network model. N is an integer variable representing a layer sequence of the ML network. In an implementation, the value of N is initiated to one. The method loads a set of weighting values for the decompressed Nth layer of the ML network model into a buffer. The method installs the set of weighting values from the buffer into the decompressed Nth layer of the ML network model, with each neuron of the decompressed Nth layer of the ML network model receiving a corresponding weighting value. The method processes a set of data through the neurons of the decompressed Nth layer of the ML network model.

In a first implementation form of the computer-implemented method according to the second aspect as such, the method further includes discarding the decompressed Nth layer of the ML network model from memory. The method determines whether there are additional unprocessed layers of the ML network. In response to a determination that there are additional unprocessed layers of the ML network, the method increments N; decompresses the Nth layer of the compressed ML network model to generate the decompressed Nth layer of the ML network model; loads a second set of weighting values for the decompressed Nth layer of the ML network model into the buffer; installs the second set of weighting values from the buffer into the decompressed Nth layer of the ML network model; and processes a second set of data through the neurons of the decompressed Nth layer of the ML network model.

In a second implementation form of the computer-implemented method according to any preceding aspect as such or any preceding implementation form of any preceding aspect, the decoding information in the header includes a decode layer indication, wherein the decode layer indication is associated with a decode layer resource allocation of layer weights. In an embodiment of the second implementation form, the decode layer resource allocation is a buffer allocation of a shared buffer for storing layer weights for the multiple layer structure of the ML network model. In an embodiment of the second implementation form, the decode layer indication indicates that the layer weights of the multiple layer structure share a dynamically allocated buffer in a decoding order of the ML network model. In an embodiment of the second implementation form, the decode layer indication indicates that the decoded layer weights of the model will each be allocated with respective buffer resources in a buffer. In an embodiment of the second implementation form, the decode layer indication is carried in a decode layer shared buffer header field of the general header of the model file.

In a third implementation form of the computer-implemented method according to any preceding aspect as such or any preceding implementation form of any preceding aspect, the model file is transmitted to a limited resource system for use by the limited resource system. In an embodiment of the third implementation form, the limited resource system does not include enough non-volatile memory storage space to store the entire ML network model in an uncompressed state. In an embodiment of the third implementation form, the decompressed Nth layer of the ML network model is stored in a volatile memory of the limited resource system, and the compressed ML network model is stored in a non-volatile memory of a limited resource system.

In a fourth implementation form of the computer-implemented method according to any preceding aspect as such or any preceding implementation form of any preceding aspect, the model file also includes a serialization header.

In a fifth implementation form of the computer-implemented method according to any preceding aspect as such or any preceding implementation form of any preceding aspect, the ML network model is a deep neural network (DNN).

In a sixth implementation form of the computer-implemented method according to any preceding aspect as such or any preceding implementation form of any preceding aspect, the buffer is one of a circular buffer or a first-in first-out (FIFO) queue.

In a seventh implementation form of the computer-implemented method according to any preceding aspect as such or any preceding implementation form of any preceding aspect, the compressed ML network model is not decompressed if the layer-by-layer flag indicates no layer-by-layer operation is supported.

A third aspect and fourth aspect relates to an apparatus comprising memory and a processor configured to execute instructions for implementing any preceding aspect as such or any preceding implementation form of any preceding aspect.

The preceding aspects and implementation of the preceding aspects

For the purpose of clarity, any one of the foregoing embodiments may be combined with any one or more of the other foregoing embodiments to create a new embodiment within the scope of the present disclosure.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Unless otherwise stated, the various methods or processes described herein may be performed on any type of system or device having a processor capable of executing instructions that implement the process. The instructions may be stored in a data storage component or a memory unit of the system. The instructions may be written in any type of programming language and may be packaged in a software application or be integrated as a system function.

The present disclosure applies to artificial neural networks, such as DNNs comprising multiple layers of neurons. A DNN is an artificial neural network (ANN) with multiple layers between the input and output layers. A neural network may be very large in size, and can require a large amount of memory for execution. In the future, it may be desirable to be able to use neural networks in small devices, including phones, tablets, Internet of Things (IoT) devices, remote sensing or control devices, data loggers, or other electronic devices. These devices typically do not include sufficient processing capability and memory to be able to store and execute a neural network model. Thus, the present disclosure provides various embodiments for performing model compression to enable a limited resource device to store and execute a neural network model.

Figure 1:
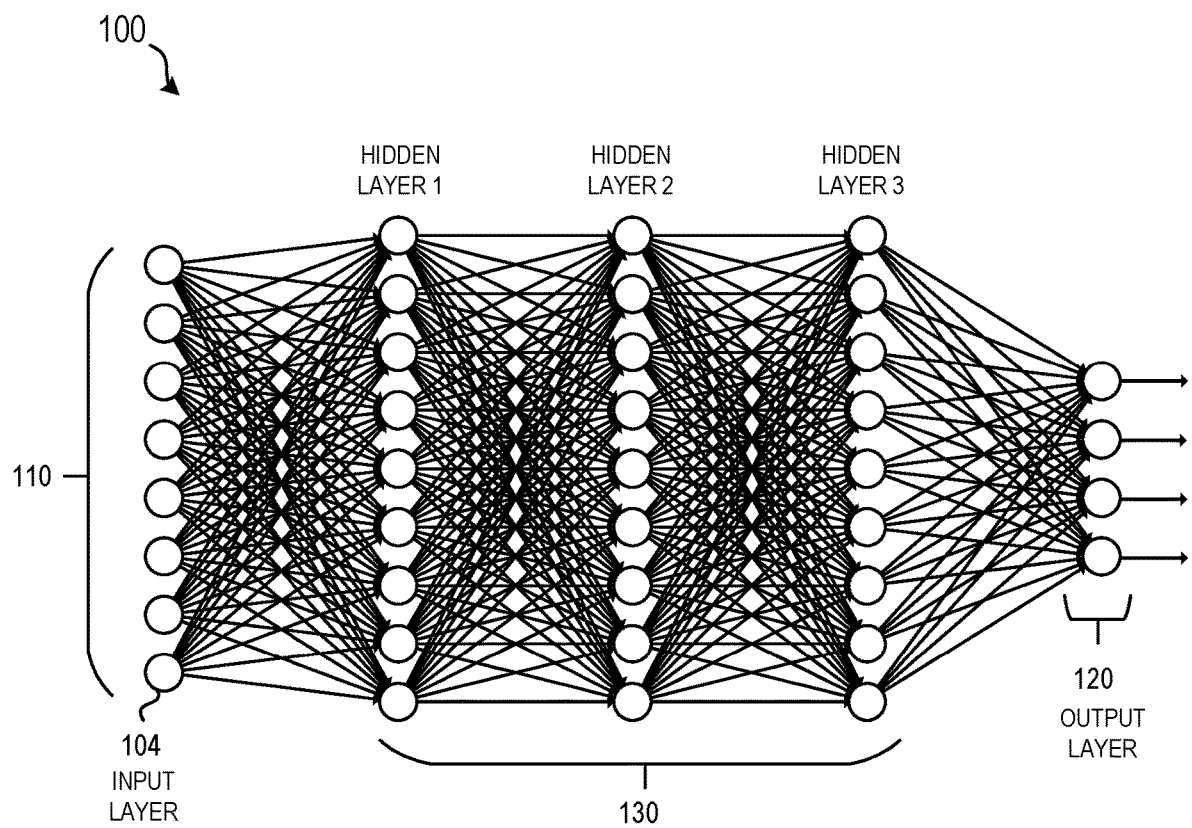
FIG. 1 is a schematic drawing illustrating an example of a deep neural network in accordance with an embodiment of the present disclosure.

FIG. 1 is a schematic drawing illustrating an example of a deep neural network 100 in accordance with an embodiment of the present disclosure. The deep neural network 100 is organized into a plurality of layers, including an input layer 110, an output layer 120, and one or more hidden or intermediate layers 130 between the input layer 110 and the output layer 120. Each layer of the deep neural network 100 comprises a plurality of neurons 104. Each neuron 104 in a layer is connected to the neurons 104 in the next layer to indicate that the output of a neuron 104 can be used as input to the connected neurons 104 in the next layer. For example, a neuron 104 of an intermediate (or hidden) layer 130 has links to some or all of the neurons 104 of a preceding layer. However, a neuron 104 may not necessarily have links to every neuron 104 of the preceding layer.

Each neuron 104 of each layer can be associated with a weighting factor that affects and changes data passing through the neuron 104. For example, a weighting can increase or decrease the amplitude of the data at the neuron 104. For instance, when an input is received at a particular neuron 104, it can be multiplied by a weight value. However, a neuron will typically include multiple weights, with a weight value commonly being normalized to a value between zero and one. In some embodiments, a neuron 104 can combine all data or inputs received by that neuron 104. In addition, the input may be subject to other and/or additional activations or activation functions that likewise can transform the inputted value in some manner. A neuron includes weights for each input link, wherein the inputs are combined according to the weights. A weight value of zero for an input link will act as if no link is present and will not pass that particular input value. In contrast, a weight of one will pass the entire input value. Each output link of a neuron also has a corresponding weight, wherein the value at the neuron is passed over each output link to a next neuron according to the corresponding output weight. The artificial neurons 104 in a series of hidden layers 130 will operate to combine signals by applying different weights to them, and passing the result to the next layer. As a result, when a set of inputs are applied to the input layer 110, an output is generated that is dependent on the layer organization and on the weights of the individual neurons 104. It should be understood that each layer in the deep neural network 100 can perform different transformations, or even different types of transformations.

Changing the organization of the deep neural network 100, such as by adding or removing links from a particular neuron 104 to preceding or following layers, will affect the processing performed by the deep neural network 100. Adding a link comprises changing the corresponding weight to a non-zero value, while removing a link comprises changing the corresponding weight to zero. Alternatively, or in addition, changing the weights of a neuron 104 or neurons 104 will likewise affect the processing performed by the deep neural network 100. In some embodiments, computations performed in the deep neural network 100 may be distributed over a population of processing nodes or processors, which may be configured in one or more computational chains. These multi-layered architectures may be trained one layer at a time and may be fine-tuned using back propagation.

The deep neural network 100 may be trained to perform various tasks. The training can be supervised, semi-supervised, or unsupervised. As non-limiting examples, the deep neural network 100 can be trained to perform image recognition, speech recognition, natural language processing, audio recognition, filtering, machine translation, bioinformatics, and medical image analysis. Other uses are contemplated and are within the scope of this disclosure.

Figure 2:
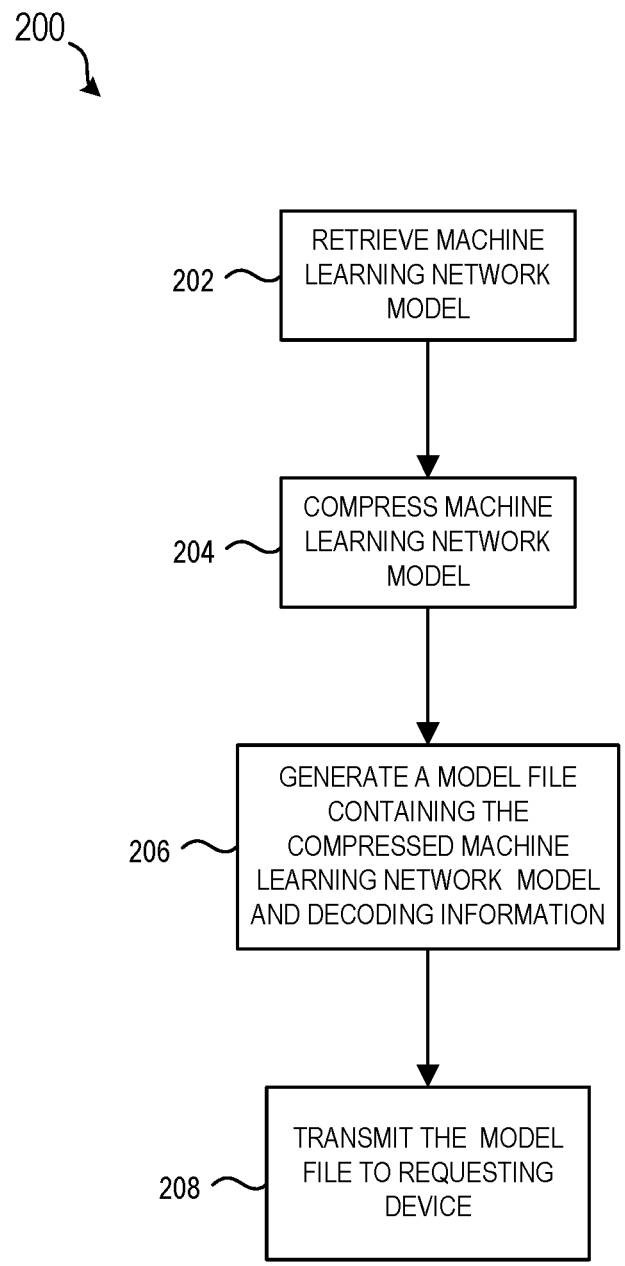
FIG. 2 is a flowchart illustrating a process for performing model compression in accordance with an embodiment of the present disclosure.

FIG. 2 is a flowchart illustrating a process 200 for performing model compression in accordance with an embodiment of the present disclosure. The process 200 can be performed by a device or a system that supports a machine learning network. The process 200 begins at step 202 by retrieving a ML network model. It should be understood that the ML network model has already been trained. The compression is performed for usage of the ML network model with actual data. The ML network model may be retrieved from a data storage component or a memory unit of the system, or may be retrieved from a remote network device. The ML network model may be any type of ANN model such as, but not limited to, a deep CNN and a DNN. The ML network model has a multiple layer structure with neurons at each of the layers as described above.

The process at step 204 compresses the ML network model to produce a compressed ML network model. Various neural network compression techniques can be used to perform the model compression, including parameter pruning and sharing, low-rank factorization, transferred/compact convolutional filters, and knowledge distillation. For example, parameter pruning and sharing can reduce redundant parameters which are not sensitive to model performance. Using low-rank factorization, certain connections between the neurons may be removed because some weights of a network will always contribute more to the prediction than others. For example, one way to compress a convolution layer is to sort the weights for that layer from small to large and throw away the connections with the smallest weights. The process of removing the less contributing weights to compress the network is called pruning. The tradeoff when a neural network is compressed is size versus accuracy. Ideally, in the various embodiments, the compression produces the smallest possible ML network model that can most accurately represent the intended result of the model.

The process at step 206 generates a model file containing the compressed machine learning network model and decoding information. The decoding information can include a decode layer indication (or flag) that is associated with a decode layer resource allocation of layer weights. As an embodiment, the decode layer resource allocation might refer to a buffer allocation of a shared buffer for storing layer weights of multiple layers. Correspondingly, the decode layer indication might indicate that the layer weights of multiple layers share a dynamically allocated buffer in the order of model decoding or are allocated with respective buffer resources in a buffer. As an embodiment, the decode layer indication might be carried in a header. For example, the decode layer indication can be carried in a "decode layer shared buffer" header field of a general header of the model file as described below.

The process at step 208 can transmit the model file to a requesting device for use by the requesting device. In some embodiments, the model file can be pushed to one or more devices without requiring a device to request the model file. In an embodiment, the requesting device or device receiving the model file is a limited resource device. A limited resource device is a device or system that does not have sufficient processing capability and/or memory to be able to store and execute a neural network model in an uncompressed form. Non-limiting examples of a limited resource device can include an IoT device or a mobile device such as a smart phone. In some embodiments, a limited resource device can also include a device or system that can execute a neural network model in an uncompressed form, but doing so would cause the device to operate in an inefficient manner and/or deplete resources of the system that may affect the capability of the device to perform other functions.

Figure 3:
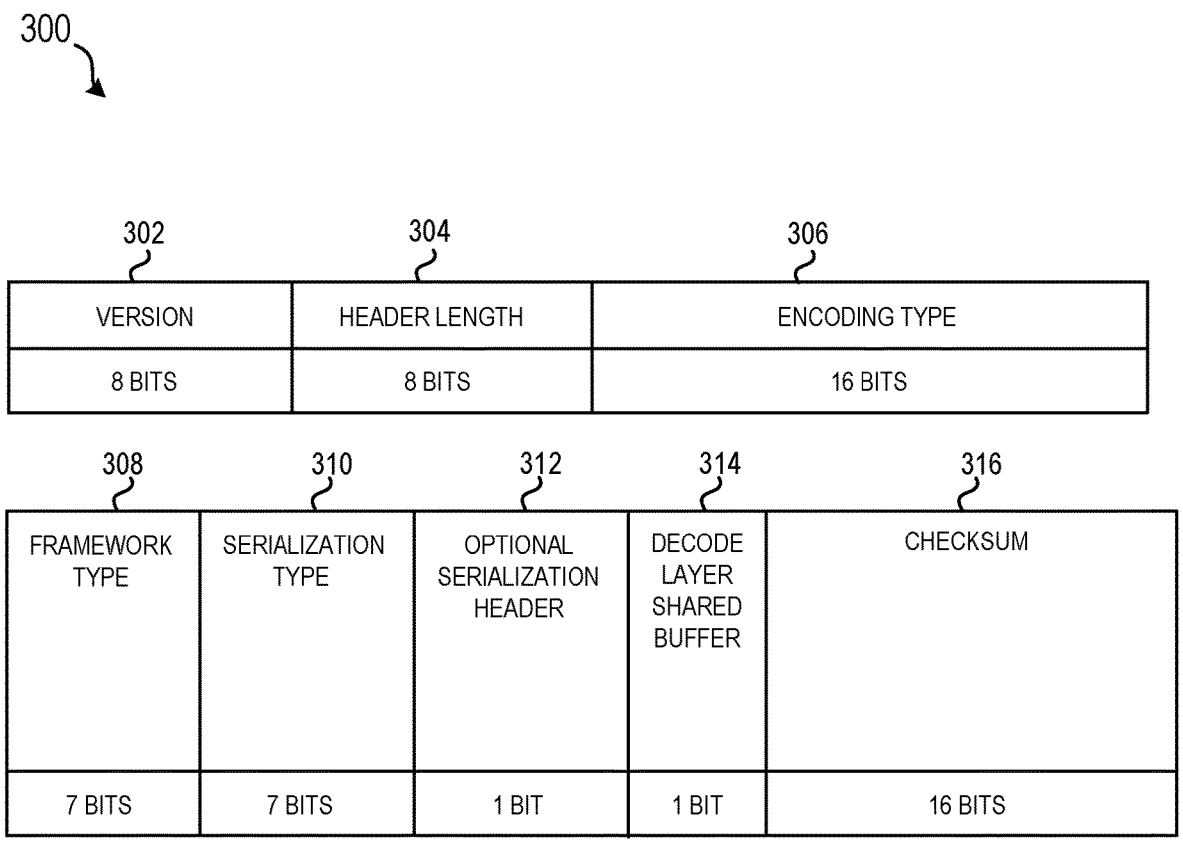
FIG. 3 is a schematic diagram of a general header of a model file in accordance with an embodiment of the present disclosure.

FIG. 3 is a schematic diagram of a general header 300 of a model file in accordance with an embodiment of the present disclosure. The general header 300 includes a version field 302, a header length field 304, an encoding type field 306, a framework type field 308, a serialization type field 310, an optional serialization header field 312, a decode layer shared buffer field 314, and a checksum field 316.

In an embodiment, the version field 302 is an 8 bits field and is used to indicate a version of the model file being used. For example, the model file version may be updated for security purposes, to increase efficiency, and/or to correct one or more issues with the model compression format. The version field 302 enables the receiving device to verify that it is decoding and executing a compress machine learning network model according to the specifications of a particular version.

The header length field 304 is 8 bits and is used to indicate the length of the general header 300. In an embodiment, the general header 300 is the first 8 bytes of the model file.

In an embodiment, the encoding type field 306 is 16 bits. The encoding type field 306 indicates the type of encoding used in the model compression. For example, the encoding type field 306 can indicate that 1, 2, 4, or 8 bits quantization and/or pruning is used. Quantization refers to the process of reducing the number of bits that represent a number. It has been demonstrated that weights and activations can be represented using 8-bit integers (or INT8) without incurring significant loss in accuracy. The use of even lower bit-widths, such as 4, 2, or 1 bits may also be used in certain embodiments.

The framework type field 308 is used to indicate the machine learning framework associated with the compressed machine learning network model. A machine learning framework is an interface, library, or tool that allows developers to more easily and quickly build machine learning models. Non-limiting examples of machine learning framework include Caffe, TensorFlow, Amazon machine learning (Amazon ML), and Apache Mahout. In an embodiment, the framework type field 308 is 7 bits.

The serialization type field 310 is used to indicate the serialization type. Serialization is the process of converting structured data into its raw form. For example, serialization can convert an object into a stream of bytes to store the object or transmit it to memory, a database, or a file. The reverse process is called deserialization. Non-limiting examples of serialization types include Pickle, HDF5, Protocol Buffers, and FlatBuffers. In a preferred embodiment, FlatBuffers is used because it has wide compatibility and high deserialization speed. In an embodiment, the serialization type field 310 is 7 bits.

The optional serialization header field 312 is a 1 bit field used to indicate whether there is an optional serialization header after the general header 300 associated with the model file. The optional serialization header can specify additional details regarding the serialization type such as, but not limited to, a model structure length (e.g., using 32 bits) and/or a schema length (e.g., using 16 bits).

The decode layer shared buffer field 314 is a decode layer indication that is associated with a decode layer resource allocation of layer weights. For example, in the depicted embodiment, the decode layer shared buffer field 314 is a 1 bit field that is used to indicate whether the decoded layer weights share a dynamically allocated buffer in the order of model decoding. For instance, a 0 value in the decode layer shared buffer field 314 can indicate that the decoded layer weights share a dynamically allocated buffer in the order of model decoding. A value of 1 in the decode layer shared buffer field 314 can indicate that the model decoding allocates a large initial buffer to store decoded layer weights of the whole model. Alternatively, a value of 1 in the decode layer shared buffer field 314 can indicate that the decoded layer weights of the model will be allocated with respective buffer resources in a buffer. An example of a model decoding process with a shared buffer among layers in accordance with an embodiment is described below.

The checksum field 316 is a 16 bits field that is used to indicate the checksum for the whole model file. A checksum is a small-sized datum derived from a block of digital data for the purpose of detecting errors that may have been introduced during its transmission or storage. The checksum can be used to ensure that the entire model file is obtained.

As shown above, the general header 300 of a model file can specify a number of combinations with different encoding types, framework types, and serialization types. Each of the above options should be specified for a model format. In some embodiments, their attributes can be defined in an optional header. The disclosed architecture of the general header 300 enables a high level of compatibility for various model compression characteristics.

Figure 4:
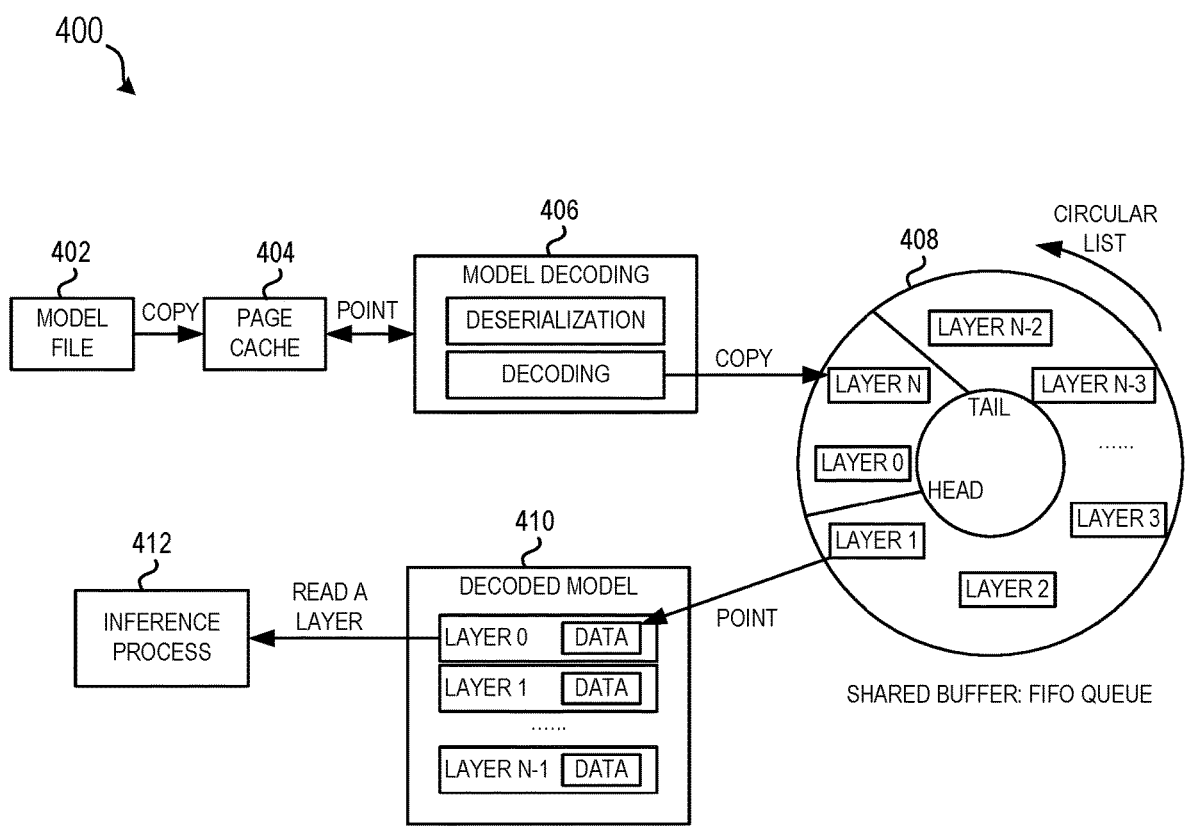
FIG. 4 is schematic diagram illustrating a model decoding process according to an embodiment.

FIG. 4 is schematic diagram illustrating a model decoding process 400 according to an embodiment. The model decoding process 400 uses a shared buffer to process model layers, one layer at a time. The model decoding process 400 can be performed by any type of system with sufficient processing capability and memory resources. Alternatively, the model decoding process 400 can be performed by a limited resource device that does not have sufficient processing capability and/or memory to be able to store and execute a neural network model in an uncompressed form.

The model decoding process 400 begins with a model file 402. The model file 402 is generally stored in a secondary storage device such as a hard disk drive (HDD) or a solid-state drive (SSD). The model file 402 includes a trained ML model. The model decoding process 400 begins reading or copying portions of the model file 402 into a page cache 404. The page cache 404, also referred to as a disk cache, is an unused portion of the main memory (e.g., random access memory (RAM)) that is used by the operating system (OS) for quicker access to data for improving system performance. A page is the basic unit of memory, typically, a 4 kilobit (Kb) area of memory. New pages are added to the page cache 404 to satisfy read requests. If the page is not already in the page cache 404, a new entry is added to the page cache 404 and filled with the data read from the disk. If there is enough free memory, the page is kept in the page cache 404 for an indefinite period of time and can then be reused without accessing the disk.

The model decoding process 400 refers to the page cache 404 when performing model decoding 406. For example, in an embodiment, when the bit in the decode layer shared buffer field 314 (i.e., a decode_layer_shared_buffer_flag) is set equal to 1, a model decoding module 406 performs deserialization and decoding of the model file 402 by layers and in the order of the layers of the ML network model. In the depicted embodiment, a circular list or first-in first-out (FIFO) queue can be implemented within a shared buffer 408. The decoded layer weights for each respective layer are inserted layer by layer (a layer at a time) at the tail of the circular list in the shared buffer 408. In an embodiment, the decoded model 410 maintains data pointers of the current layer (e.g., layer 1) to the head item of the circular list. The serialization decompresses a layer of the model and serially outputs the information of the layer to the shared buffer 408. As the information of the layer is received, it is held by the shared buffer 408. The weights from the shared buffer 408 are subsequently transferred to the decoded model 410, which processes the data against the layer. The processed data is held and is processed by each successive layer until the data has been processed by every layer of the model.

Once the model decoding process 400 accesses the current layer weights from the ML network model and has completed the inference process 412 for this layer, the layer weights can be released and are free to be replaced by a new layer in the shared buffer 408. Inference is the process of applying new data to the trained model. In an embodiment, the layer weights can be released by simply moving the head of the list to the next item. In an embodiment, if there is insufficient free buffer available for the next new layer, the model decoding process 400 will wait until enough buffer space is freed. In an embodiment, if the circular list is empty when the inference process 412 reads the weights data, the inference process 412 will also wait until the weights for a new layer are decoded and inserted into the circular list.

In an embodiment, the model decoding process 400 can increase the shared buffer 408 dynamically, based on a decoding policy. The decoding policy for initialization and dynamical increasing of the shared buffer 408 can be determined by the model decoding 406 function. The policies in various systems may be different depending on their hardware environment or application requirements.

Figure 5:
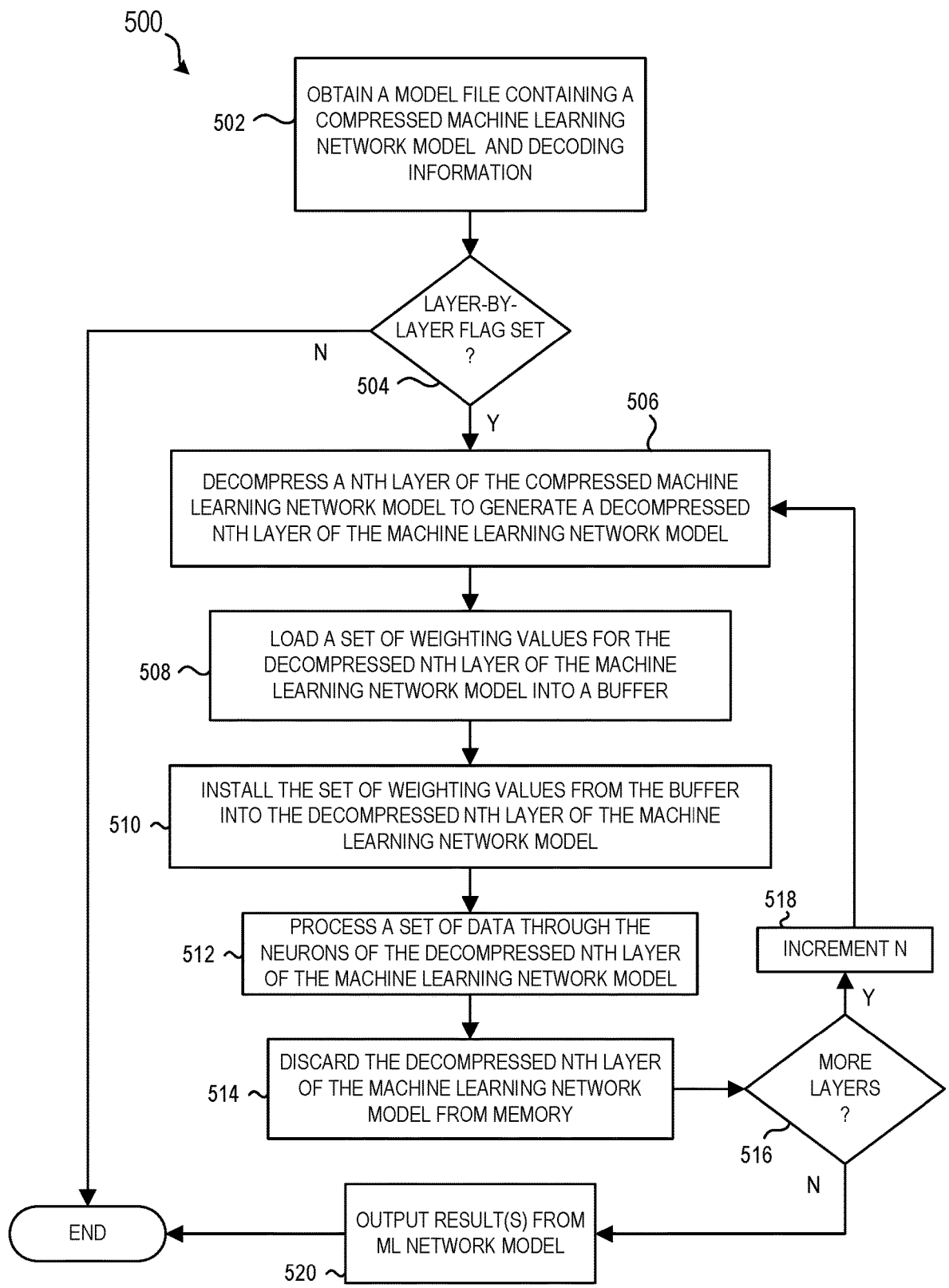
FIG. 5 is a flowchart illustrating a process for executing a ML network model in a resource limited system in accordance with an embodiment of the present disclosure.

FIG. 5 is a flowchart illustrating a process 500 for executing a ML network model in a resource-limited system in accordance with an embodiment of the present disclosure. The model decoding process 500 can be performed by any type of system with sufficient processing capability and memory resources. In particular, the model decoding process 500 can be performed by a limited resource device that does not have sufficient processing capability and/or memory to be able to store and execute a neural network model in an uncompressed form.

The process at step 502 obtains a model file that includes a compressed machine learning network model and decoding information. As described above, the decoding information can be contained in a general header or other optional headers of the model file. The decoding information can include a decode layer indication (or layer-by-layer flag) that is associated with a decode layer resource allocation of layer weights.

At step 504, the process determines whether the layer-by-layer flag is set (e.g., whether layer-by-layer flag value set equal to 1) in the decoding information to determine whether the compressed machine learning network model can be decompressed and executed layer-by-layer in accordance with the present disclosure. If the layer-by-layer flag is not set, the process terminates. Alternatively, in some cases, the system may execute the compressed machine learning network model entirely in an uncompressed form if the system resources are sufficient.

However, if the layer-by-layer flag is set, the process at step 506 decompresses an Nth layer of the compressed machine learning network model to generate a decompressed Nth layer of the machine learning network model. As used herein, N is an integer variable that represents a layer sequence of the compressed machine learning network model. For example, N can be initiated to a value equal to one to indicate that the first layer in the compressed machine learning network model is to be decompressed and executed.

At step 508, the process loads a set of weighting values for the decompressed Nth layer of the machine learning network model into a buffer. As described above, the buffer may be a shared buffer for storing layer weights of multiple layers.

At step 510, the process installs the set of weighting values from the buffer into the decompressed Nth layer of the machine learning network model by setting the weighting values for each of the neurons of the decompressed Nth layer of the machine learning network model.

The process at step 512 performs the inference process by processing a set of data through the neurons of the decompressed Nth layer of the machine learning network model. The process 500 stores the output data of the decompressed Nth layer of the machine learning network model so that it can be used as input data for the next layer of the machine learning network model.

At step 514, the process discards the decompressed Nth layer of the machine learning network model from memory in preparation for receiving and processing a next layer. The process 500 may also change the pointer of a circular list in the shared buffer to indicate that the set of weighting values for the decompressed Nth layer of the machine learning network model is no longer needed and the memory space in the shared buffer can be reused or freed.

The process at step 516 determines if there are additional layers in the compressed machine learning network model that have not been decompressed. If the process 500 determines that there are additional layers, the process 500, at step 518, increments the N variable (e.g., N++) so that the next Nth layer of the machine learning network model can be decompressed and processed by repeating steps 506-514 for each layer of the machine learning network model.

If the process determines that there are no additional layers to decompress and execute (i.e., the Nth layer of the machine learning network model equals the output layer), the process at step 520 outputs the result(s) of the machine learning network model based on the input data set, with the process terminating thereafter.

Figure 6:
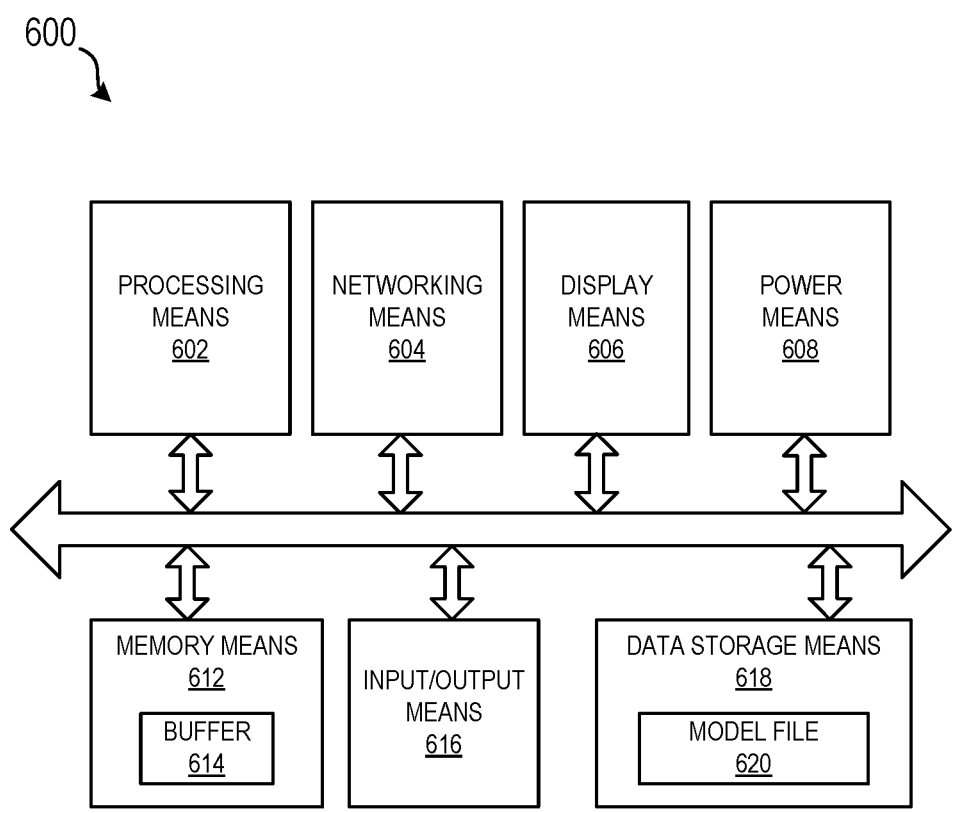
FIG. 6 is a block diagram illustrating various components of a system that may be used to carry out the processes described herein.

FIG. 6 is a block diagram illustrating various components of a system 600 that may be used to carry out the processes described herein. For example, the system 600 can be used to perform the processes described in FIG. 2 and FIG. 5. Referring to FIG. 6, the system 600 can be implemented in various forms including, but not limited to, a personal computer (e.g., a desktop or laptop), a mobile device (e.g., a smartphone or tablet), and a network device (e.g., a server).

The system 600 includes processing means 602, networking means 604, display means 606, power means 608, memory means 612, input/output (I/O) means 616, and data storage means 618. Although only a single unit of each of the above components is depicted, the system 600 can include multiple units of each component. For example, the system 600 can include one or more processing means 602 such multiple processors, a single processor having multiple processing cores, multiple microprocessors, and other circuitry capable of being programmed or capable of executing instructions for implementing the embodiments of the present disclosure. For example, the processing means 602 can execute instructions for compressing an ML network model, generating a model file for the compressed ML network model, and decompressing and executing the ML network model layer by layer. Additionally, in some embodiments, the instructions for implementing the embodiments of the present disclosure may be distributed and executed across multiple processing units or sub-units that cooperate in executing the program instructions. In certain embodiments, one or more digital signal processors (DSPs) may be included as part of the system 600 in place of or in addition to a general purpose CPU.

The networking means 604 enables the system 600 to communicate data with other devices (not shown) over a communication network or collection of networks (not shown). Communications may be in the form of wired or wireless communication, and is not limited to any particular protocol. The networking means 604 may include one or more of network interface cards, antennas, power amplifiers, radio frequency (RF) circuitry, transceivers, and other communication circuitry. The networking means 604 can be used to obtain or transmit a model file comprising a compressed ML network model and decoding information in accordance with an embodiment.

The display means 606 may be an integrated display component of the system 600 such as a display for smart phone or laptop device. Alternatively, the display means 606 may be a display port or graphics card that enables an external monitor or display to be coupled to the system 600. The power means 608 can be a battery unit or a power unit that converts alternating current (AC) to low-voltage regulated direct current (DC) power for the internal components of the system 600.

The memory means 612 provides a storage facility for temporarily storing data and instructions. For example, the memory means 612 can be volatile memory such as, but not limited to, random access memory (RAM). In an embodiment, the memory means 612 is used to store each uncompressed layer of the machine learning network model as it is being processed. After processing, allocated space in the memory means 612 for the uncompressed layer can be freed or written over by the next uncompressed layer of the machine learning network model. Additionally, as described above, portions of the memory means 612 can be used as a buffer 614 for storing the weights of each layer of the machine learning network model as each layer is being decompressed and processed. In some embodiments, a circular list may be implemented in the buffer 614 to enable the sharing of the buffer 614 among the layers of the machine learning network model. Alternatively, in some embodiments, a separate buffer 614 may be allocated and deallocated for each layer of the compressed machine learning network model as needed.

The I/O means 616 provides data input and data output capabilities, such as I/O interfaces that enable the system 600 to be communicatively coupled to other devices. For example, the I/O means 616 may enable an input device such as, but not limited to, a pointing device or keyboard to be used with the system 600.

The data storage means 618 can be nonvolatile memory such as, but not limited to, a HDD, flash memory, or a SSD. In some embodiments, the data storage means 618 may be removable or may be an external drive. The data storage means 618 may be implemented as a single storage device but may also be implemented across multiple storage devices or sub-systems co-located or distributed relative to each other. Additionally, in some embodiments, the data storage means 618 can be a computer readable storage media readable by the processing means 602 and capable of storing software including instructions for performing various processes. Software may also include additional processes, programs, or components, such as operating system software, database management software, or other application software. Software may also include firmware or some other form of machine-readable processing instructions executable by the processing means 602.

As described herein, the data storage means 618 can be used to store a model file 620 comprising a compressed machine learning network model and decoding information. In addition, the data storage means 618 may store weights and other datasets used with the machine learning network model. The processing means 602 can execute instructions for implementing the processes associated with the model file 620 as described herein.

It should be noted that one or more components of the system 600 may be included in a system-on-a-chip (SoC) device. These components may include, but are not limited to, the processing means 602, elements of the data storage means 618, and even elements of the networking means 604. One of ordinary skill in the art would recognize that the system 600 may also include other components not depicted or described in FIG. 6, or alternatively, the system 600 can exclude certain components depicted in FIG. 6 without affecting the scope of the various embodiments.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, components, techniques, or methods without departing from the scope of the present disclosure. Other examples of changes, substitutions, and alterations are ascertainable by one skilled in the art and may be made without departing from the spirit and scope disclosed herein.

What is claimed is:

1. A computer-implemented method for performing model compression, the method comprising:
    compressing a machine learning (ML) network model comprising a multiple layer structure to produce a compressed ML network model, the compressed ML network model maintaining the multiple layer structure of the ML network model; and
    generating a model file for the compressed ML network model, the model file comprising the compressed ML network model and decoding information for enabling the ML network model to be decompressed and executed layer-by-layer.

2. The method of claim 1, wherein the decoding information is stored in a general header of the model file.

3. The method of claim 2, wherein the general header is a first eight bytes of the model file.

4. The method of claim 2, wherein the general header provides a version, total header length, encoding type, framework type, and serialization type.

5. The method of claim 2, wherein the decoding information in the general header comprises a decode layer indication, wherein the decode layer indication is associated with a decode layer resource allocation of layer weights.

6. The method of claim 5, wherein the decode layer resource allocation is a buffer allocation of a shared buffer for storing layer weights for the multiple layer structure of the ML network model.

7. The method of claim 5, wherein the decode layer indication indicates that the layer weights of the multiple layer structure share a dynamically allocated buffer in a decoding order of the ML network model.

8. The method of claim 5, wherein the decode layer indication indicates that the layer weights of the ML network model will each be allocated with respective buffer resources in a buffer.

9. The method of claim 5, wherein the decode layer indication is carried in a decode layer shared buffer header field of the general header of the model file.

10. The method of claim 1, wherein the model file further comprises a serialization header.

11. The method of claim 1, further comprising transmitting the model file to a limited resource system.

12. The method of claim 1, wherein the ML network model is a deep neural network (DNN).

13. A computer-implemented method for executing a machine learning (ML) network model, the method comprising:
    obtaining a model file comprising a compressed ML network model and decoding information for enabling layer-by-layer decompression and execution, the decoding information comprising a layer-by-layer flag;
    determining whether the layer-by-layer flag is set in the model file;
    responsive to the layer-by-layer flag being set in the model file, decompressing an Nth layer of the compressed ML network model to generate a decompressed Nth layer of the ML network model, where N is an integer variable representing a layer sequence of the ML network;
    loading a set of weighting values for the decompressed Nth layer of the ML network model into a buffer;
    installing the set of weighting values from the buffer into the decompressed Nth layer of the ML network model, with each neuron of the decompressed Nth layer of the ML network model receiving a corresponding weighting value; and
    processing a set of data through the neurons of the decompressed Nth layer of the ML network model.

14. The method of claim 13, wherein the decoding information is stored in a general header of the model file.

15. The method of claim 14, wherein the general header is a first eight bytes of the model file.

16. The method of claim 14, wherein the general header provides a version, total header length, encoding type, framework type, and serialization type.

17. The method of claim 14, wherein the decoding information in the general header comprises a decode layer indication, wherein the decode layer indication is associated with a decode layer resource allocation of layer weights.

18. The method of claim 17, wherein the decode layer resource allocation is a buffer allocation of a shared buffer for storing layer weights of multiple layers.

19. The method of claim 18, wherein the decode layer indication indicates that the layer weights of multiple layers share a dynamically allocated buffer in an order of model decoding.

20. The method of claim 17, wherein the decode layer indication is carried in a decode layer shared buffer field of the general header.

21. The method of claim 13, wherein the model file further comprises a serialization header.

22. The method of claim 13, further comprising:
    discarding the decompressed Nth layer of the ML network model from memory;
    determining whether there are additional unprocessed layers of the ML network;
    responsive to a determination that there are additional unprocessed layers of the ML network:
    incrementing N and generating a N+1 index value;
    decompressing the N+1 layer of the compressed ML network model to generate the decompressed N+1 layer of the ML network model;
    loading weighting values for the decompressed N+1 layer of the ML network model into the buffer;
    installing the weighting values from the buffer into the decompressed N+1 layer of the ML network model; and
    processing a second set of data through neurons of the decompressed N+1 layer of the ML network model.

23. The method of claim 13, wherein the ML network is a deep neural network (DNN).

24. The method of claim 13, wherein the buffer is a circular buffer or a first-in first-out (FIFO) queue.

25. The method of claim 13, wherein the layer-by-layer flag is updated when the ML network model is compressed.

26. The method of claim 13, wherein the layer-by-layer flag is decompressed separately from and before decompression of the Nth layer of the compressed ML network model.

27. The method of claim 13, wherein the compressed ML network model is not decompressed if the layer-by-layer flag indicates no layer-by-layer operation is supported.

28. The method of claim 13, further comprising storing the compressed ML network model in a non-volatile memory of a device, and storing the decompressed Nth layer of the ML network model in a volatile memory of the device.

29. The method of claim 13, further comprising storing both the compressed ML network model and the decompressed Nth layer of the ML network model in a non-volatile memory of a device.

* * * * *